United States Patent [19]

Umkehrer

[11] Patent Number: 4,469,963
[45] Date of Patent: Sep. 4, 1984

[54] MONOLITHICALLY INTEGRATED SEMICONDUCTOR CIRCUIT INCLUDING $I^2L$ CELLS AND OTHER CIRCUIT PARTS

[75] Inventor: Walter Umkehrer, Munich, Fed. Rep. of Germany

[73] Assignee: Siemens Aktiengesellschaft, Berlin and Munich, Fed. Rep. of Germany

[21] Appl. No.: 528,993

[22] Filed: Sep. 2, 1983

Related U.S. Application Data

[63] Continuation of Ser. No. 212,507, Dec. 3, 1980.

[30] Foreign Application Priority Data

Dec. 6, 1979 [DE] Fed. Rep. of Germany ....... 2949201

[51] Int. Cl.$^3$ ............................................ H03K 19/091
[52] U.S. Cl. ......................................... 307/477; 357/92
[58] Field of Search ........... 307/446, 459, 477, 296 R, 307/250; 357/92

[56] References Cited

U.S. PATENT DOCUMENTS

| | | | |
|---|---|---|---|
| 4,013,901 | 3/1977 | Williams | 307/477 X |
| 4,071,774 | 1/1978 | Tokumara et al. | 357/92 X |
| 4,091,296 | 5/1978 | Suzuki et al. | 357/92 X |
| 4,109,162 | 8/1978 | Heuser et al. | 357/92 X |
| 4,137,465 | 1/1979 | Hart | 307/477 |
| 4,243,896 | 1/1981 | Chapron | 357/92 X |
| 4,256,984 | 3/1981 | Kojima | 307/475 X |
| 4,270,059 | 5/1981 | Nishizawa et al. | 307/446 |

FOREIGN PATENT DOCUMENTS 2723973 12/1977 Fed. Rep. of Germany.

OTHER PUBLICATIONS

K. Kaneko, T. Okabe and M. Nagata from "IEEE Journal of Solid State Circuits" (Apr. 1977), SC12, pp. 210 to 212, Entitled Stacked $I^2L$ Circuit.

Primary Examiner—Stanley D. Miller
Assistant Examiner—David R. Hudspeth
Attorney, Agent, or Firm—Herbert L. Lerner; Laurence A. Greenberg

[57] ABSTRACT

Monolithically integrated semiconductor circuit having $I^2L$ cells each including a transistor and an injector, further circuit parts, a supply voltage being a multiple of a supply voltage required for operation of individual $I^2L$ cells in which a corresponding number of $I^2L$ cells are connected in series in chain fashion with respect to a first and a second supply terminal of the circuit furnishing the supply voltage for the circuit and each being acted upon by an operating potential, the injector of an $I^2L$ cell forming a first chain link being tied to the first supply terminal of the circuit; the emitter of the transistor of the $I^2L$ cell forming the first chain link being tied to the injector of a further $I^2L$ cell forming a second chain link; the injector of an $I^2L$ cell forming a third chain link being tied to the emitter of the transistor of the $I^2L$ cell forming the second chain link, further $I^2L$ cells similarly connected to the respective preceding chain link forming a respective chain link completing the chain, the emitter of this $I^2L$ cell being connected to the second supply terminal of the circuit carrying the reference potential of the circuit, and the injector of this last $I^2L$ cell being connected to the emitter of the transistor of the $I^2L$ cell forming the next to the last chain link, including a further $I^2L$ cell assigned to at least one of the links of the chain formed by $I^2L$ cells connected in series with respect to their supply potentials.

5 Claims, 3 Drawing Figures

MONOLITHICALLY INTEGRATED SEMICONDUCTOR CIRCUIT INCLUDING I²L CELLS AND OTHER CIRCUIT PARTS

This application is a continuation of application Ser. No. 212,507, filed Dec. 3, 1980.

BACKGROUND OF THE INVENTION

1. Field of the Invention

The invention relates to a monolithically integrated semiconductor circuit which includes I²L cells and further circuit parts, the supply voltage of which is a multiple of the supply voltage required for the operation of the individual I²L cells, in which a corresponding number of I²L cells are accordingly connected in series in chain-fashion with respect to the two supply terminals of the circuit which furnish the supply voltage for the circuit and are acted upon by an operating potential each, in that the injector of an I²L cell forming a first chain link is tied to the first supply terminal of the circuit; the emitter of the transistor of the I²L cell forming the first chain link is tied to the injector of a further I²L cell forming the second chain link; the injector of an I²L cell forming the third chain link is tied to the emitter of the transistor of the I²L cell forming the second chain link, in which the chain is finally completed, using further I²L cells connected in the same manner to the respective preceding chain link and forming a respective chain link, by the I²L cell forming the last chain link, in that the emitter of this I²L cell is connected to the second supply terminal designated as VB* in the figures of the circuit which carries the reference potential of the circuit, while the injector of this last I²L cell is directly connected to the emitter of the transistor of the I²L cell forming the next to the last chain link.

2. Description of Prior Art

Details regarding I²L cells may be found, for instance, in "Valvo Berichte", Volume XVIII, No. 1/2, (1974), pages 215 to 236. As is well known, the individual I²L cells include a combination of a vertical npn transistor, with an injector constructed as a lateral pnp transistor. The base of each is surrounded by the emitter and the collectors of which each is surrounded by the base, the collector forming the signal output and the base terminal the signal input. The base of the lateral transistor is identical with the emitter of the vertical transistor and the collector of the lateral transistor is identical with the base of the vertical transistor.

The supply terminals of the I²L cells are represented by the emitter of the lateral transistor, i.e. the injector, and the emitter of the vertical transistor. Since the values of binary potential states of an I²L cell are $U_H = 0.7$ V and $U_L$ approximately $-0.1$ V and therefore a voltage excursion of about 0.8 V is needed, the problem arises, in a monolithic combination of I²L cells with other digital circuit parts, of matching the I²L cells to the supply voltage required for the overall circuit which in the case of TTL circuits is approximately 5 V, while the I²L cell requires a voltage $U_I$ for the injector of about 0.8 V. For this reason, the construction of the I²L circuits is carried out in accordance with the manner described hereinafore to build up a network of I²L cells, so to speak. Pertinent details may be found, for instance, in a paper by K. Kameko, T. Okabe and M. Nagata from the literature reference "IEEE Journal of Solid State Circuits" (April 1977), SC12, pages 210 to 212.

One problem arising in such I²L combinations is already solved in German Published Non-Prosecuted Application DEOS No. 27 23 973, using an auxiliary circuit. The price of this solution, however, is a considerable amount of circuitry.

On the basis of the description given hereinafore, the available supply voltage is subdivided by the individual links of the chain of I²L cells connected between the two supply voltage terminals of the integrated semiconductor circuit into equal partial voltages, each of which is allocated as the supply voltage to the respective I²L cell forming the respective chain link. The individual partial supply voltages, however, are assigned to staggered values of the potential at the emitters of the transistors of the individual I²L cells. Since the individual I²L cells interact as a rule with other I²L cells and these I²L cells are likewise connected between the two supply terminals as links of a chain of I²L cells, with respect to the supply voltages that serve for setting their operating point, it may happen that one I²L cell controls further I²L cells, which are not acted upon exclusively by the same values of the potential present at their injector and the potential present at the emitter of its transistor as is the controlling I²L cell. Thus, a cell to be controlled can be acted upon by supply potentials which are either closer to the first supply potential or closer to the second supply potential, i.e. the reference potential, than the I²L cell under consideration. If the controlled I²L cell is closer to the supply potential of the overall circuit with respect to its two supply potentials than the cell under consideration, this control is called an up control. It does not involve special problems and can therefore be ignored in the further consideration.

If, however, the controlled I²L cell is closer to the second supply potential, i.e. to the reference potential of the circuit, with respect to its supply potentials, concern is raised about the so-called down control. As has already been set forth in the German Published Non-Prosecuted Application DEOS No. 27 23 973, down operation, i.e. controlling an I²L cell belonging to a lower potential level or stack plane by an I²L cell belonging to a higher I²L cell goes along with a delay of the switching operation, because it then takes the transistor of the controlled I²L cell a particularly long time to be ready for operation again when a signal provided by the controlling I²L cell decays.

SUMMARY OF THE INVENTION

It is accordingly an object of the invention to provide a monolithically integrated semiconductor circuit including I²L cells and other circuit parts which overcomes the hereinafore-mentioned disadvantages of the heretofore-known devices of this general type, and to eliminate this adverse effect on the switching speed.

With the foregoing and other objects in view there is provided, in accordance with the invention, a monolithically integrated semiconductor circuit having I²L cells each including a transistor and an injector, further circuit parts, a supply voltage being a multiple of a supply voltage required for operation of individual I²L cells in which a corresponding number of I²L cells are connected in series in chain fashion with respect to a first and a second supply terminal of the circuit furnishing the supply voltage for the circuit and each being acted upon by an operating potential, the injector of an I²L cell forming a first chain link being tied to the first supply terminal of the circuit; the emitter of the transistor of the I²L cell forming the first chain link being tied to the injector of a further I²L cell forming a second chain link; the injector of an I²L cell forming a third chain link being tied to the emitter of the transistor of the I²L cell forming the second chain link, further I²L cells similarly connected to the respective preceding chain link forming a respective chain link completing the chain, the emitter of this further I²L cell being connected to the second supply terminal of the circuit carrying the reference potential of the circuit, and the injector of this last I²L cell being connected to the emitter of the transistor of the I²L cell forming the next to the last chain link, comprising a further I²L cell assigned to at least one of the links of the chain formed by I²L cells connected in series with respect to their supply potentials, the further I²L cell being controlled by the chain link and the supply potentials thereof being at least as far from i.e. not closer to, the supply potential furnished by the first supply terminal of the circuit than the supply potentials of the controlling I²L cell; and the two supply potentials of the controlled I²L cell being combined in a single supply potential, the injector input of the controlled I²L cell and the emitter of the transistor thereof being connected together to the emitter of the transistor of an I²L cell belonging to the chain of I²L cells, the supply potential acting on the emitter of the transistor of the I²L cell belonging to the chain of I¹L cells being at least as close to, i.e. not further away from, the reference potential supplied by the second supply terminal of the circuit as the potential controlling the emitter of the transistor of the I²L cell forming the controlling chain link.

If the totality of the I²L cells connected with their injectors directly to the first supply terminal of the circuit is designated as the first supply level, the totality of the I²L cells that obtain their injector supply potential from the I²L cells of the first supply level, as the second supply level, and so forth, and finally the totality of the I²L cells connected to the second terminal of the circuit carrying the reference potential, as the last supply level. In this case, the just given definition of the invention means that the controlled I²L cell belongs either to the same supply level as the controlling I²L cell or it must be counted, as a supply level which is higher-numbered in comparison to the controlling I²L cell, i.e. is closer to the reference potential. The first-mentioned case is of interest only if the controlling I²L cell and the controlled I²L cell are connected together to the reference potential; the second case, namely the case in which the supply level of the controlled I²L cell is closer to the second supply potential of the circuit, i.e. at the reference potential than the level of the controlling I²L cell, is the more general case. The second case is always applied if the controlling transistor does not belong to the highest-numbered supply level, associated with the reference potential, of the I²L network.

Besides the just described I²L cells, which are controlled in down operation, I²L cells also occur as a rule which are controlled by I²L cells that belong to a higher-numbered supply level, which is therefore closer to the reference potential, than the controlled I²L cell. In these cases, the controlled I²L cells are connected in the customary manner, i.e. like the individual links of the I²L supply chain, so that the injector and the emitter of the transistor of the respective cell are at supply potentials which are different from each other. In the case of I²L cells controlled in up-operation, no particular measure is therefore taken, if the former is used in addition to down-operation in an I²L circuit according to the invention.

In accordance with another feature of the invention, the potential at the emitter of the transistor of the controlled I²L cell is closer to the reference potential of the circuit than the potential at the emitter of the transistor of the controlling I²L cell.

In accordance with a further feature of the invention, the I²L cells are identical.

In accordance with an added feature of the invention, the base of the transistor of the controlled I²L cell is directly connected to the collector of the transistor of the controlling I²L cell.

In accordance with an additional feature of the invention, there is provided a diode connecting the collector of the transistor of the controlling I²L cell to an I²L cell to be controlled which is closer to the reference potential.

In accordance with a concomitant feature of the invention, there is provided an injector connecting the collector of the transistor of the I²L cell to be controlled to the base of the transistor of the controlled I²L cell.

Other features which are considered as characteristic for the invention are set forth in the appended claims.

Although the invention is illustrated and described herein as embodied in a monolithically integrated semiconductor circuit including I²L cells and other circuit parts, it is nevertheless not intended to be limited to the details shown, since various modifications and structural changes may be made therein without departing from the spirit of the invention and within the scope and range of equivalents of the claims.

BRIEF DESCRIPTION OF THE DRAWING

The construction and method of operation of the invention, however, together with additional objects and advantages thereof will be best understood from the following description of specific embodiments when read in connection with the accompanying drawings, in which.

DESCRIPTION OF THE PREFERRED EMBODIMENTS

Figure 1:
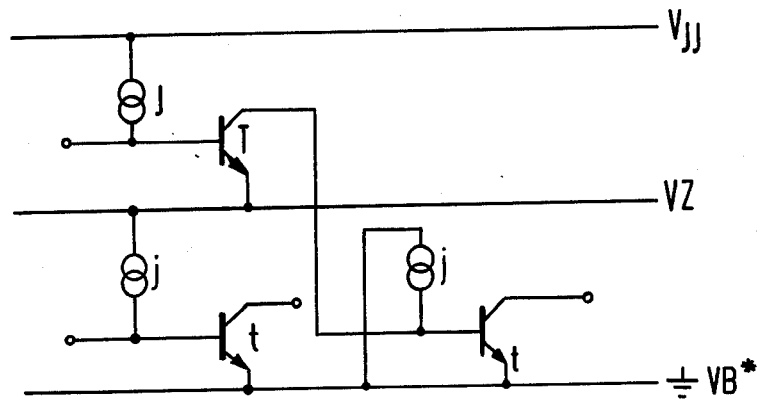
FIGS. 1 to 3 are schematic diagrams of I²L cells of the invention.
Figure 2:
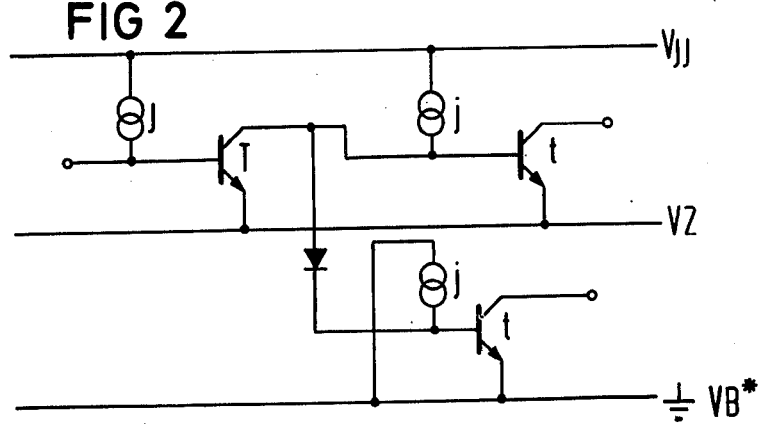
Figure 3:
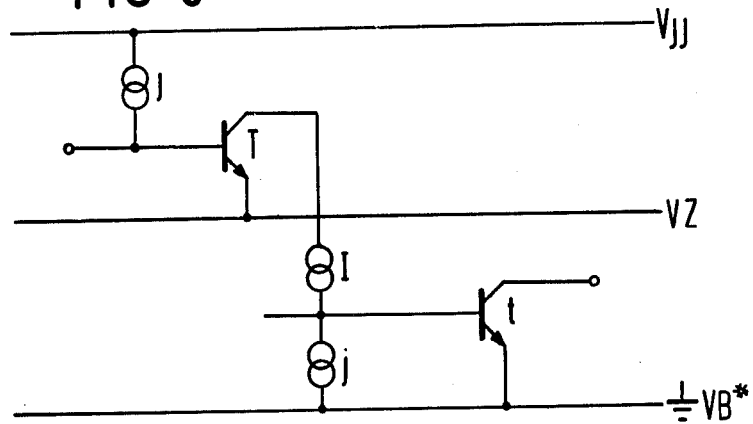

Referring now more particularly to FIGS. 1 to 3 of the drawing as a whole, it is seen that the transistor T is the transistor of the controlling I²L cell and J is its injector. The supply potential for the injector J is designated with reference symbol $V_{JJ}$ and corresponds to the first supply potential furnished by the first supply terminal of the circuit, if the controlling I²L cell belongs to the first supply level. In the other cases, the supply potential $V_{JJ}$ for the injector of the controlling I²L cell corresponds to the potential at the emitters of the transistors of the I²L cells belonging to the next supply level in the direction toward the first supply potential.

The transistors of the respective controlled I²L cell are designated with reference symbol t and their injector with j. The emitter potential for the transistor T of the controlling I²L cell is VZ and corresponds to the potentials in the individual nodes of the I²L network, since it is derived by voltage division of the total supply voltage supplied by the two supply terminals of the circuit.

In the embodiment shown in FIG. 1, the base of the transistor t of the cell to be controlled is directly connected to the collector of the transistor T of the controlling I²L cell. If, however, the supply potentials of the controlling and the controlled I²L cell are not immediately adjacent as in FIG. 1, but if one or more supply potentials must be jumped, then one or more diodes must be inserted into the connection from the collector of the controlling transistor T to the base of the controlled transistor to in such a manner that the collector or anode of the diode or the diodes is always connected to the collector of the controlling transistor T and the emitter or cathode of the diode or diodes is connected to the base of the controlled transistor t. The input of the injector j of the controlled I²L cell and the emitter of its transistor t are at a common potential VB*. By virtue of the potential obtained due to the voltage division described above, the common potential VB* is applied to the emitter of the I²L cells of one of the supply levels of the I²L cells belonging to the I²L network, which is closer to the reference potential VB of the overall circuit and the supply level $V_{JJ}/VZ$ to which the controlling I²L cell belongs. Optionally, the potential VB* may be identical with the potential VB, as is easily seen. According to the invention, the emitter of the transistor t of the controlled I²L cell is now connected, together with the input of the injector j of this cell, to the emitter supply potential VB* of a supply level which is closer to the reference potential VB than the supply potential level of the controlling I²L cell.

In the case shown in FIG. 2, the transistor T of the controlling I²L cell on one hand controls a cell belonging to the same supply level and on the other hand, in down operation, it controls a further I²L cell belonging to some supply level. Similar to FIG. 1, the control is accomplished by the action of the collector of the transistor of the controlling I²L cell on the base of the transistor t of the controlled I²L cell.

In the embodiment set forth in FIG. 2, the collector of the transistor T of an I²L cell simultaneously controls the input of an I²L cell belonging to the same supply level and the input of an I²L cell belonging to a lower supply level, i.e., one closer to the common reference potential VB. For this reason, a diode D is provided between the transistor T of the controlling I²L cell and the transistor t of the controlled I²L cell from the lower supply level. The diode D is not required if connected to the transistor t of the I²L cell belonging to the same supply level as the controlling I²L cell.

In the circuit shown in FIG. 3, an injector I is disposed between the input of the controlled I²L cell belonging to the lower supply level and the controlling I²L cell belonging to the higher supply level. This construction of the injector I corresponds to that of the other injectors of the I²L cells. It is accordingly formed by a second injector zone which is disposed in the vicinity of the base zone of the transistor t that belongs to the lower supply level and is connected to the collector of the transistor T of the controlling I²L cell in a conducting manner. Meanwhile the first injection zone forming the injector j is connected to the emitter of the transistor t of this cell and, together with the latter, is connected to the second supply potential VB* of this cell.

The objective of the invention is to attempt to clear out the charge carriers in the base of the transistors in the controlled I²L cells as fast as possible, even if the controlled I²L cell belongs to a lower supply level than the controlling I²L cell, which is specifically for the case of down operation, i.e. an I²L cell belonging to a lower supply level is controlled by an I²L cell from a higher supply level. The achievement of the invention is that in this case the switching speed is also not slowed down more than in the case in which the controlling I²L cell and the controlled I²L cell belong to the same supply level.

If simultaneous logical linkages are provided between I²L cells of the same supply level and I²L cells of lower supply levels in changing over, the diode D shown in FIG. 2 is provided between the output of the controlling I²L cell belonging to the higher supply level and the input of the controlled I²L cell belonging to a lower supply level, while such a diode is not necessary for controlling the I²L cell belonging to the same supply level as the controlling I²L cell. The anode of the diode D is then connected to the collector of the transistor T of the controlling I²L cell, and the cathode of this diode D is connected to the base of the transistor t of the I²L cell belonging to the lower supply level.

The circuit is usually implemented so that the vertical transistor T or t, respectively, is of the npn type, and the lateral transistor, i.e. the injector J, j, I is of the pnp type. Conversely, the vertical transistor could also be of the pnp type and the lateral transistor of the npn type. This means a reversal of the supply voltage.

There is claimed:

1. In a monolithically integrated semiconductor circuit, comprising a first supply voltage terminal and a second supply voltage terminal (said second supply voltage terminal carrying the reference potential for the circuit) a plurality of I²L cells each respectively forming a vertical transistor having base, emitter and collector electrodes and an injector having an input, said first and said second supply voltage terminals being connected to each other by a chain consisting of said I²L cells directly disposed adjacent each other in serially stacked connection, the chain including a first I²L cell and a last I²L cell, the first I²L cell having the input of the injector thereof connected to said first supply voltage terminal, the last I²L cell of said chain having the emitter electrode of the vertical transistor thereof connected to said second supply voltage terminal, and in each pair of directly adjacent I²L cells of said chain the emitter electrode of the vertical transistor of the I²L cell connected closer to said first supply voltage terminal being directly conductively connected to the input of the injector of the I²L cell connected closer to said second supply voltage terminal, said integrated semiconductor circuit further comprising a controlling connection between the collector electrode of the vertical controlling transistor of an I²L cell belonging to said chain and the base electrode of the vertical transistor of a controlled further one of said I²L cells, which does not belong to said chain but is conductively connected at the emitter electrode of its vertical transistor to the emitter electrode of the vertical transistor of an I²L cell, which belongs to said chain but lies closer in said chain to the second supply voltage terminal than said controlling I²L cell, the input of the injector of said controlled I²L cell being exclusively connected to the emitter electrode of the vertical transistor of said controlled I²L cell.

2. Semiconductor circuit according to claim 1, wherein the collector electrode of the vertical transistor of said controlling I²L cell is directly connected to the base electrode of the vertical transistor of said controlled I²L cell.

3. Semiconductor circuit according to claim 2, wherein the emitter electrode of the vertical transistor of said controlled I²L cell being connected to the emitter electrode of the vertical transistor of an I²L cell of said chain, said I²L cell being adjacent to the controlling I²L cell disposed in direction toward the second supply voltage terminal.

4. Semiconductor circuit according to claim 1, wherein the emitter electrode of the vertical transistor of said controlled I²L cell is connected to the emitter electrode of an I²L cell belonging to said chain, which is separated at least by one I²L cell of said chain from the controlling I²L cell, the controlling connection between the collector of said controlling I²L cell and the base of said controlled I²L cell contains at least one diode.

5. Semiconductor circuit according to claim 1, wherein the controlling connection between the collector of said controlling I²L cell and the base of said controlled I²L cell consists of a further injector, the input of which is connected to the collector of the vertical transistor of said controlling I²L cell and the output of which is connected to the base of the vertical transistor of said controlled I²L cell.

* * * * *